United States Patent [19]
Eklund

[11] Patent Number: 5,506,158
[45] Date of Patent: Apr. 9, 1996

[54] BICMOS PROCESS WITH SURFACE CHANNEL PMOS TRANSISTOR

[75] Inventor: Robert H. Eklund, Plano, Tex.

[73] Assignee: Texas Instruments Incorporated, Dallas, Tex.

[21] Appl. No.: 280,953

[22] Filed: Jul. 27, 1994

[51] Int. Cl.⁶ .......................... H01L 21/265; H01L 29/76
[52] U.S. Cl. ................. 437/41; 437/46; 437/47; 437/60; 437/109; 437/200; 437/233; 437/918; 437/913; 437/933; 257/370; 257/379; 257/384; 257/408; 257/412
[58] Field of Search ..................... 257/370, 379, 257/384, 408, 412; 437/41, 46, 47, 60, 200, 109, 233, 918, 913, 933

[56] References Cited

U.S. PATENT DOCUMENTS 5,107,321  4/1992  Ilderem et al. .................... 257/274

Primary Examiner—Edward Wojciechowicz
Attorney, Agent, or Firm—Jacqueline J. Garner; Richard L. Donaldson; William E. Hiller

[57] ABSTRACT

A BiCMOS device 10 having a bipolar transistor 60, a PMOS transistor 64 and a p-type polysilicon resistor 70. Bipolar transistor 60 is comprised of an emitter electrode 30, base region 26, and collector region formed by well region 18. PMOS transistor 64 comprises source/drain regions 52, gate electrode 40, and gate oxide 28. PMOS transistor 64 may also comprises LDD regions 44. The emitter electrode 30 and gates 40 are formed out of the same polysilicon layer and thus have the same thickness. If desired, the emitter electrode 30 and gate electrodes 40 may be silicided.

12 Claims, 4 Drawing Sheets

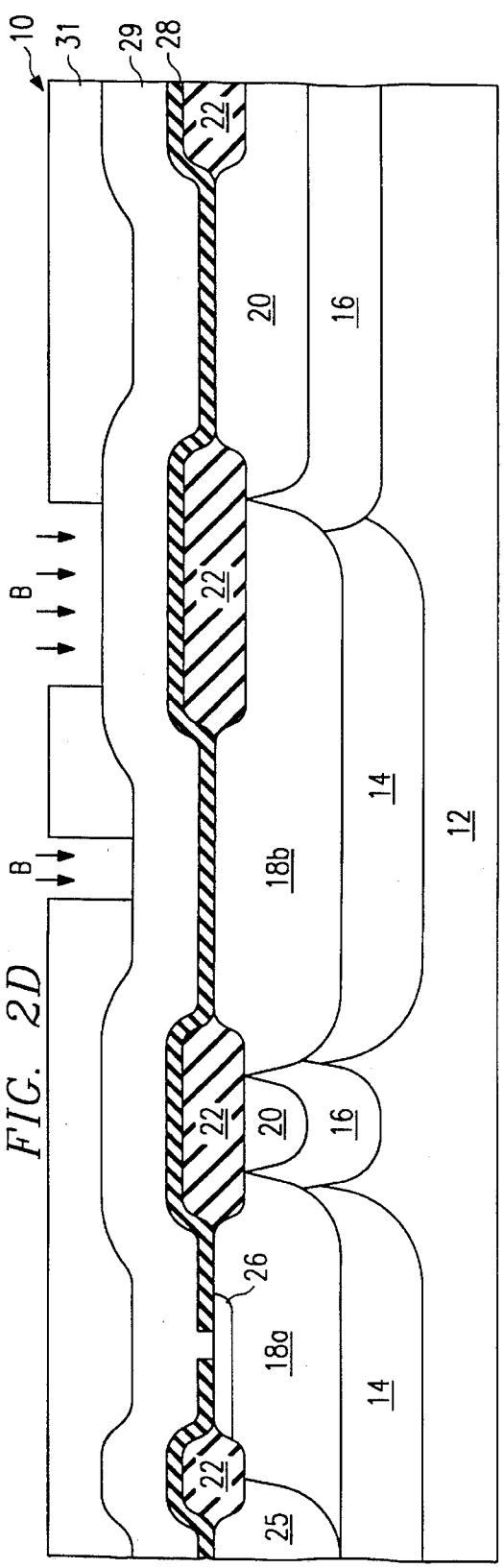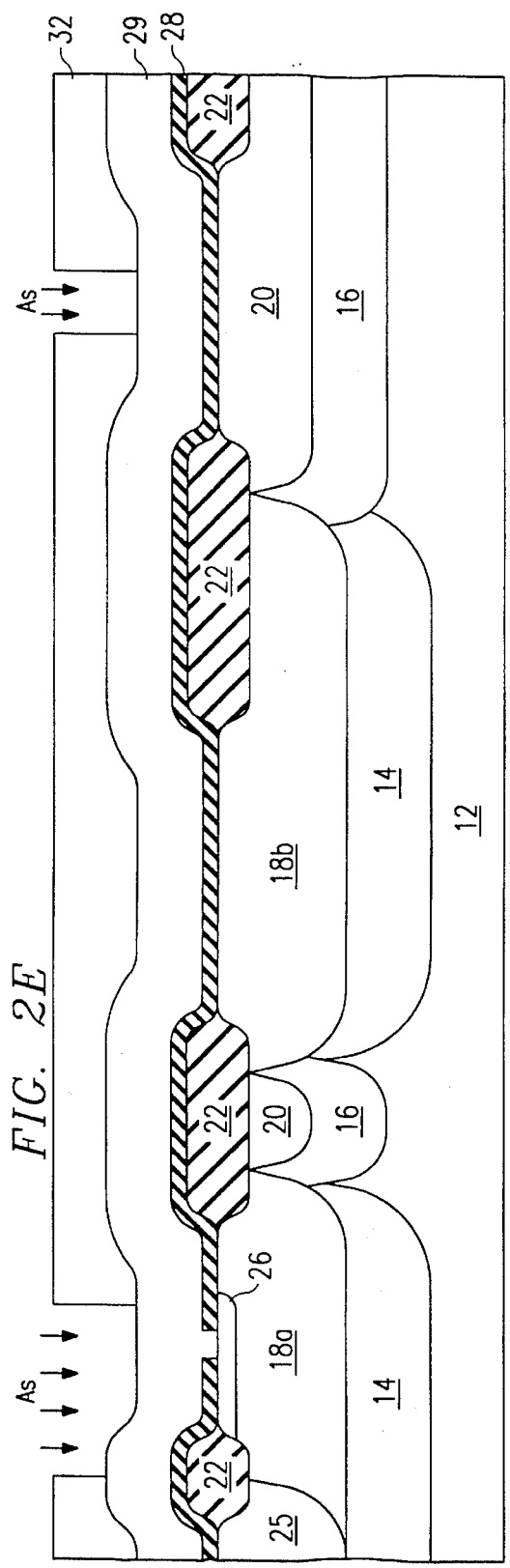

5,506,158

BICMOS PROCESS WITH SURFACE CHANNEL PMOS TRANSISTOR

FIELD OF THE INVENTION

This invention generally relates to semiconductor devices and processes and more specifically to BiCMOS devices and processes with surface channel PMOS transistors.

BACKGROUND OF THE INVENTION

The integration of MOSFET structures and bipolar transistors on a single substrate has become very desirable. As is well known in the art, digital and linear functions are often performed by integrated circuits using either bipolar or metaloxide semiconductor (MOS) technology. Bipolar integrated circuits, of course provide higher speed operation and greater drive currents than the MOS circuits, at the cost of higher power dissipation, especially when compared against complementary MOS (CMOS) circuits. Advances in manufacturing technology have allowed the use of both bipolar and CMOS transistors in the same integrated circuit. These are commonly referred to as BiCMOS devices.

In a BiCMOS device, bipolar transistors are typically formed by using a moat region for the base of the bipolar transistor, doped polysilicon for the emitter, and a well region for the collector. Resistors typically comprise either a diffused region or polysilicon which is doped n-type. CMOS circuits comprise both NMOS and PMOS transistors. In order to scale the PMOS transistor and provide low threshold voltages, it is desirable to use a surface channel PMOS transistor. Thus, NMOS and PMOS transistors use doped polysilicon for the gates and diffused regions for the source/drain regions. This complicates the process by requiring both n+ and p+ polysilicon gates that are typically doped by the source/drain implants.

The source/drain implants, however, may not provide adequate doping through the polysilicon gates to the gate oxide. Adequate doping of the NMOS gates can be achieved by implanting the NMOS gates during the bipolar emitter implant. Improved doping of the PMOS gates may be achieved by scaling the polysilicon thickness. However, scaling the polysilicon thickness is undesirable in a BiCMOS process that uses the same polysilicon layer for the emitter and the NMOS and PMOS gates. Accordingly, there is still a need for adequate doping through the polysilicon to the gate oxide in a PMOS transistor that does not require the polysilicon thickness to be scaled.

SUMMARY OF THE INVENTION

A device and method for forming a semiconductor device having a surface channel PMOS transistor and a p-type resistor is disclosed herein. A conductive layer, such as polysilicon, is formed over a surface of a semiconductor body. A first area of the conductive layer is implanted with a p-type dopant. The first area corresponds to where a resistor and a plurality of PMOS transistors are to be formed. The conductive layer is then etched to form the p-type resistor and a PMOS gate for each of the PMOS transistors. A plurality of PMOS source/drain regions are then formed in the semiconductor body.

In one embodiment, a method for forming a BiCMOS device is disclosed. A first insulator layer is formed over a surface of a semiconductor body having a first well region. A base region is implanted in the first well region. The first insulator layer is then etched to expose a portion of the base region. A polysilicon layer is then formed over the surface of the semiconductor body and a first area of the polysilicon layer is implanted with a p-type dopant. The first area corresponds to where a resistor and a plurality of PMOS transistors are to be formed. A second area of the polysilicon layer corresponding to where a bipolar transistor and a plurality of NMOS transistors are to be formed is then implanted with a n-type dopant. The polysilicon layer is then etched to form an emitter electrode, PMOS gates, NMOS gates, and the resistor. The p-type dopant is then implanted into the semiconductor body adjacent the PMOS gates to form a pair of PMOS source/drain regions for each PMOS transistor, wherein the p-type dopant is also simultaneously implanted into the PMOS gates. The n-type dopant is then implanted into the semiconductor body adjacent the NMOS gates to form a pair of NMOS source/drain regions for each NMOS transistor and the n-type dopant is also simultaneously implanted into the NMOS gates.

An advantage of the invention is providing a BiCMOS process that includes the formation of a p-type resistor.

A further advantage of the invention is providing a BiCMOS process that adequately dopes the PMOS gates without having to scale the polysilicon gate thickness.

A further advantage of the invention is providing a BiCMOS process that allows the surface channel PMOS transistor to be scaled and provides low threshold voltages without having to scale the polysilicon gate thickness.

These and other advantages will be apparent to those of ordinary skill in the art having reference to this specification in conjunction with the drawings.

BRIEF DESCRIPTION OF THE DRAWINGS

In the drawings:

FIGS. 2a–g are cross-section diagrams showing various stages of fabrication of the BiCMOS device of FIG. 1.

Corresponding numerals and symbols in the different figures refer to corresponding parts unless otherwise indicated.

DETAILED DESCRIPTION OF PREFERRED EMBODIMENTS

The invention will be described herein as incorporated into a BiCMOS structure having a bipolar transistor, an NMOS transistor, a PMOS transistor, and a p-type resistor.

Figure 1:
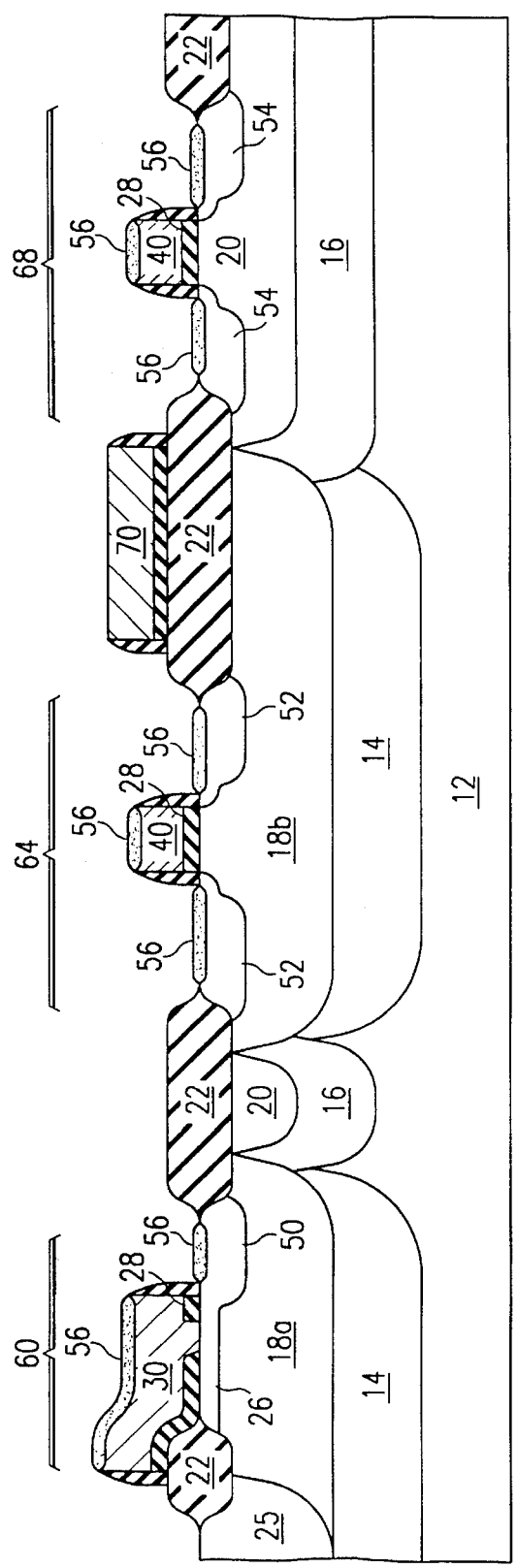
FIG. 1 is a cross-sectional diagram of a BiCMOS device according to a preferred embodiment of the invention.

FIG. 1 illustrates, in cross-section, bipolar transistor 60, PMOS transistor 64, NMOS transistor 68, and resistor 70. The structure is formed into a substrate 12 which, in this embodiment is p-type silicon. Buried n+ region 14 in bipolar transistor 60 serves as a subcollector, in the conventional manner, with n+ region 25 providing a surface contact thereto. N region 18a serves as the collector region in bipolar transistor 60. Intrinsic base 26 is a p-type region disposed within n region 18a. P+ region 50 serves as extrinsic base region of bipolar transistor 60. Emitter electrode 30 may be a doped polysilicon layer which extends through an opening in insulator layer 24 to intrinsic base region 26. Silicide layer 56 may cover emitter electrode 30.

N region 18b is the well region for p-channel transistor 64. It should be noted that PMOS transistor 64 may alternatively be formed in well region 18a as described in co-pending U.S. patent applications Ser. No. 08/161,960 filed Dec. 3, 1993 and Ser. No. 08/106,458 filed Aug. 13, 1993, both assigned to Texas Instruments, Incorporated. P+ regions 52 serve as the source/drain regions for PMOS transistor 64. N+ regions 54 serve as the source/drain regions for NMOS transistor 68. Gate oxide 28 is disposed between gates 40 and n regions 18*b* and p region 20. Doped polysilicon may be used to form gates 40 of transistors 64 and 68. Gates 40 may optionally be silicided to form silicide layer 56.

Resistor 70 comprises p-type doped polysilicon and is disposed over field insulating region 22. The advantage of having a p-type resistor instead of a n-type resistor is that the PMOS gates can be implanted both at the same time as the resistor and during the source/drain implants. Thus, adequate doping of the PMOS gates can be achieved without scaling the polysilicon thickness.

Field insulating regions 22 isolate intrinsic base region 26 from collector contact 25, transistors 64 and 68 from each other, and p-channel transistor 64 from bipolar transistor 60. N+ regions 14 below transistor 60 and 64 is separated by buried p+ region 16 and n regions 18*a–b* are separated by p region 20 to allow the n-type regions 18*a–b* of the two transistors to be at different potentials.

Figure 2A:
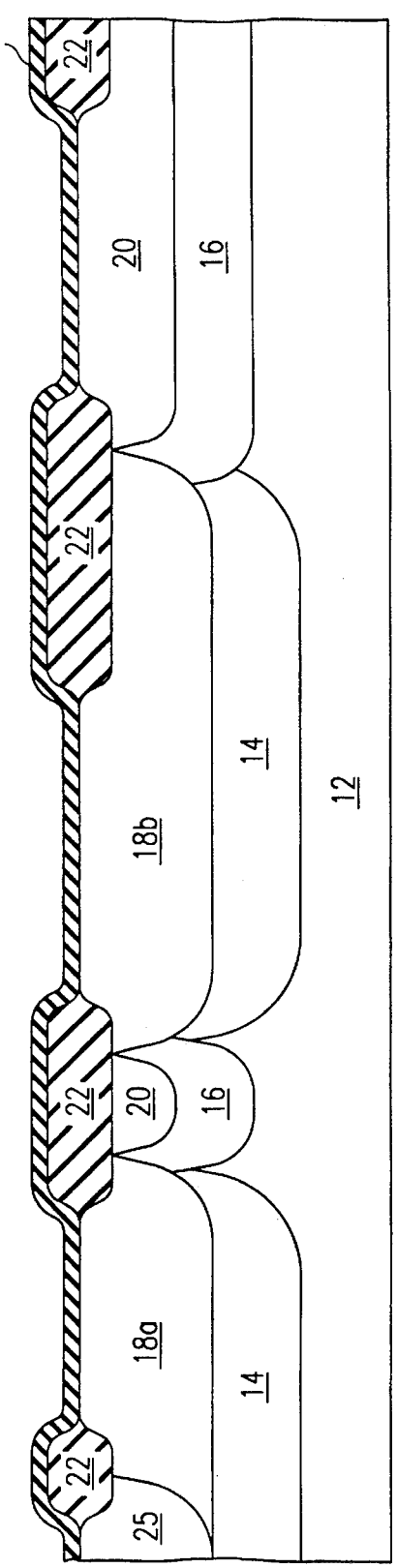

FIG. 2*a* illustrates structure 10 after the formation of n+ buried layers 14, p+ buried layers 16, n-type regions 18*a–b*, p-type regions 20, field insulating regions 22, and insulator layer 24. Methods for forming the buried layers are described in U.S. Pat. No. 4,958,213, issued Sep. 18, 1990 and assigned to Texas Instruments Incorporated. A method for forming field insulating regions 22 is described in U.S. Pat. No. 4,541,167, issued Sep. 17, 1985 and assigned to Texas Instruments Incorporated. Insulator layer 24 may be a dummy gate oxide formed via an Anti Kooi oxidation followed by a deglaze to a depth of less than 20 Å followed by a thermal oxidation to a depth on the order of 300 Å. The formation of a BiCMOS device according to the invention into the structure of FIG. 2*a* will now be described.

Figure 2B:
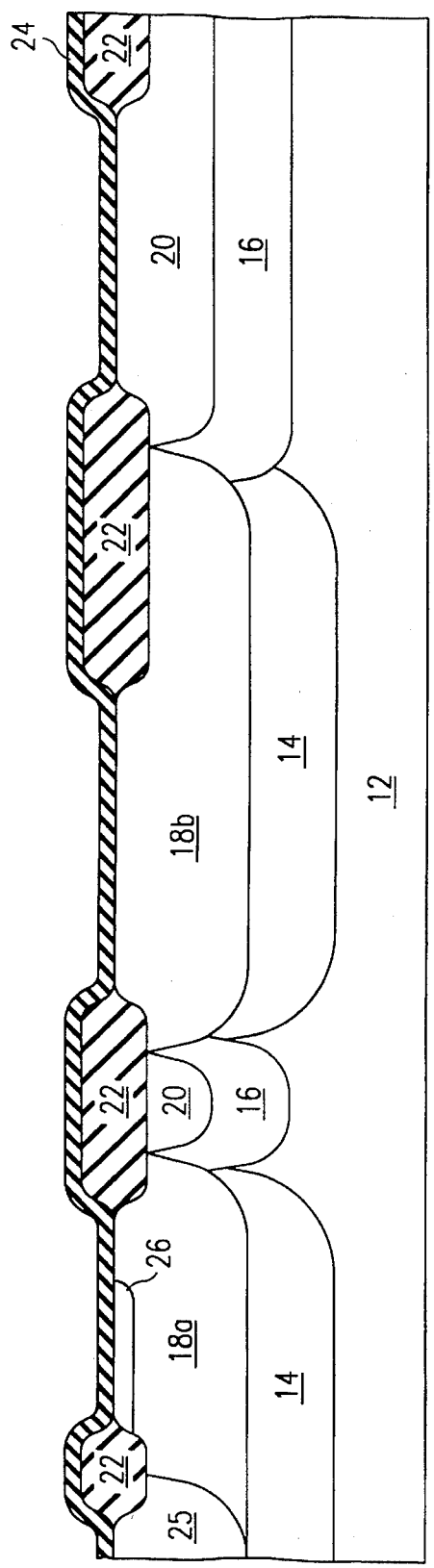

The surface of structure 10 is patterned and implanted using a n-type dopant to form a deep n-type region (collector contact 25) that extends through n region 18*a* to contact the subcollector, n+ region 14, as shown in FIG. 2*b*. Next, the $V_t$ adjust implants may be performed: one for NMOS transistor 68 and one for PMOS transistor 64. Still referring to FIG. 2*b*, the base region 26 is patterned and implanted with a p-type dopant (e.g. boron 7.0E13 cm$^{-2}$ at 10 Kev).

Figure 2C:
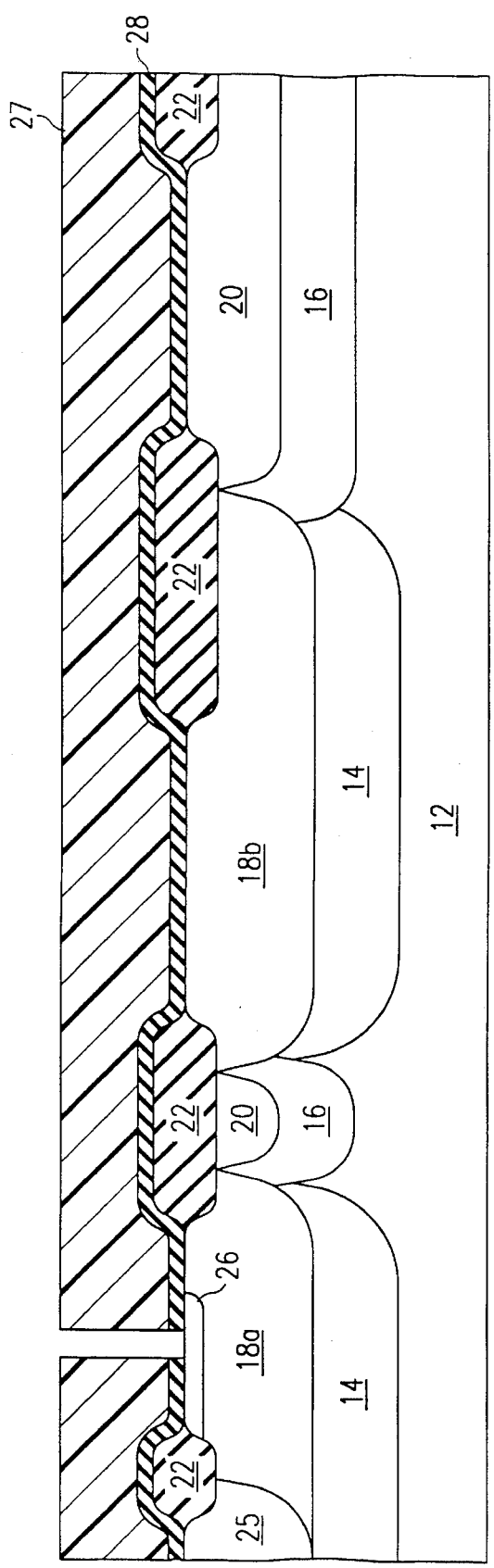

Referring to FIG. 2*c*, dummy oxide layer 24 is then removed using a deglaze and replaced with an insulator layer such as gate oxide layer 28. Gate oxide layer 28 is formed by thermal oxidation and has a thickness on the order of 100 Å. Masking layer 27 is used to expose a region of gate oxide layer 28. The exposed oxide is then etched to expose a portion of base region 26. Masking layer 27 is then removed and a deglaze is performed (e.g., 10% HF for 10 seconds) to minimize the interfacial oxide. Referring to FIG. 2*d*, a layer of conductive material, such as polysilicon layer 29, is deposited by way of LPCVD over the surface of structure 10. Polysilicon layer 29 has a thickness on the order of 3500 Å.

Still referring to FIG. 2*d*, masking layer 31 is used to expose the areas of polysilicon layer 29 where the PMOS gate and the p-type resistor are to be formed. The exposed areas are then implanted with a p-type dopant such as Boron (eg., 2E15 at 20 KeV).

Referring to FIG. 2*e*, masking layer 31 is removed and replaced with masking layer 32 which exposes the areas where the emitter and NMOS gate are to be formed. The exposed areas are then implanted with an n-type dopant such as arsenic or a combination of arsenic and phosphorous (eg. 1E16 at 100 KEV for arsenic). Masking layer 32 is then removed.

Figure 2F:
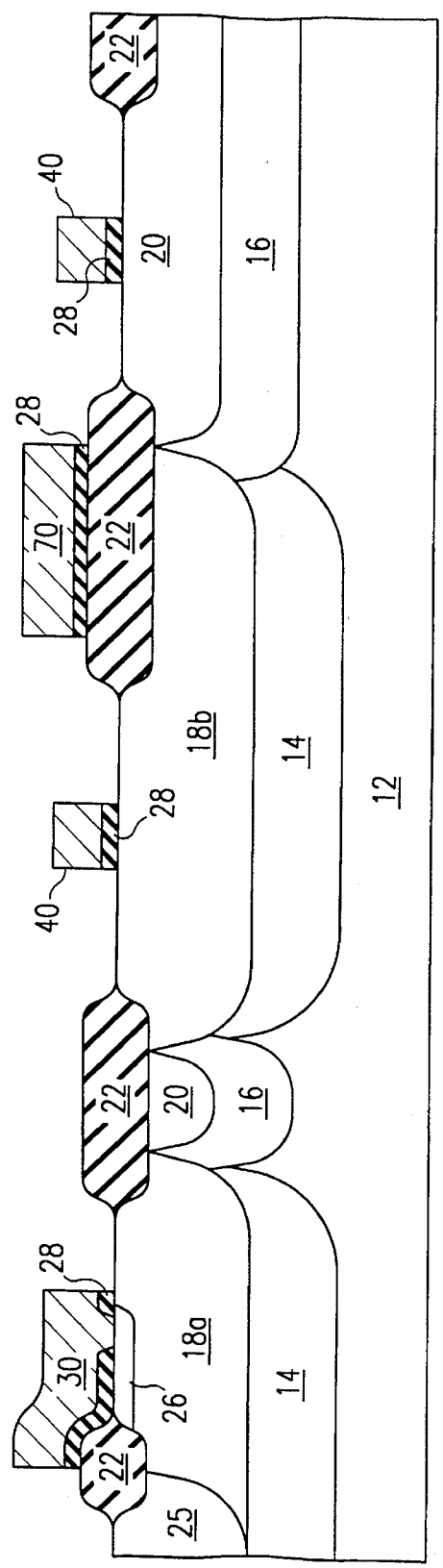

After the resistor 70 and emitter electrode 30 have been adequately doped, polysilicon layer 29 is patterned and etched as shown in FIG. 2*f* to form emitter electrode 30, gates 40, and resistor 70.

Figure 2G:
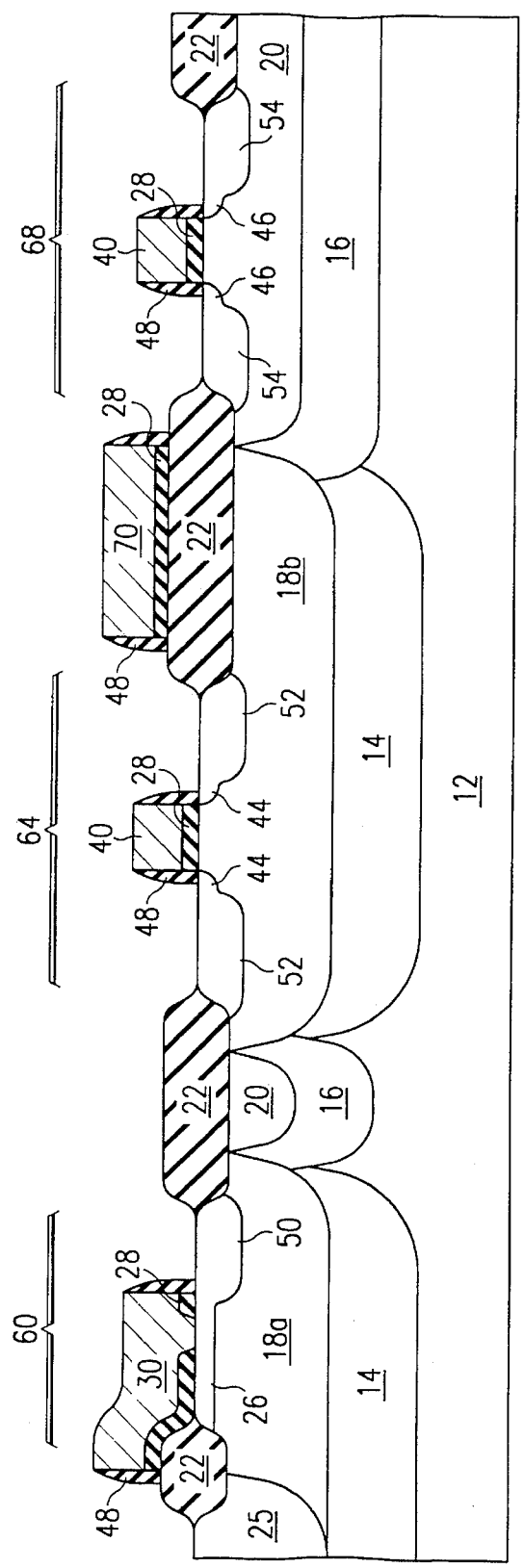

Referring to FIG. 2*g*, conventional techniques are then used to implant lightly doped drains (LDDs) 44 and 46, form sidewall spacers 48, and form source/drain regions 52 and 54. It should be noted that LDDs 44 are optional and need not be formed. Sidewall spacers 48 are formed by depositing a dielectric layer and anisotropically etching the dielectric layer. Sidewall spacers 48 preferably comprise nitride on a thin oxide but could be oxide only. After sidewall spacers 48 are formed, source/drain regions 52 and 54 are implanted with p-type and n-type dopants, respectively and annealed.

The gates 40 are also implanted during the source/drain implants. Thus, the NMOS transistor gates are implanted during both the emitter implant and the NMOS source/drain 54 implant and the PMOS transistor gates are implanted during both the resistor implant and the PMOS source/drain 52 implant. Accordingly, adequate doping can be achieved in both the NMOS and PMOS transistors.

Subsequent to the completion of the methods described above, the gates 40, source/drain regions 52 and 54, and the emitter electrode 30 may be silicided followed by the formation of the interconnecting metallization for making contact to the active regions of FIG. 1. Methods for forming such interconnections are well known in the art. Individual circuits are then separated from portions of substrate 12 and external connections made thereto by way of wire bonding, direct bump bonding, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments, Inc.

While this invention has been described with reference to illustrative embodiments, this description is not intended to be construed in a limiting sense. Various modifications and combinations of the illustrative embodiments such as performing the above-described process steps in a different order, as well as other embodiments of the invention, will be apparent to persons skilled in the art upon reference to the description. It is therefore intended that the appended claims encompass any such modifications or embodiments.

What is claimed is:

1. A method for forming a semiconductor device comprising the steps of:
   a. forming a conductive layer over a surface of a semiconductor body;
   b. simultaneously implanting a first area and a second area of the conductive layer with a p-type dopant, said first area corresponding to where a plurality of PMOS transistors are to be formed, and said second area corresponding to where a resistor is to be formed;
   c. etching said conductive layer to form a PMOS gate for each of said plurality of PMOS transistors; and
   d. forming a plurality of PMOS source/drain regions in said semiconductor body.

2. The method of claim 1, further comprising the steps of:
   a. implanting a third area of the conductive layer where a plurality of bipolar transistors and a plurality of NMOS transistors are to be formed with an n-type dopant, wherein said step of etching said conductive layer also forms an emitter electrode and a NMOS gate for each of said plurality of NMOS transistors; and b. forming a pair of NMOS source/drain regions in said semiconductor body for each of said plurality of NMOS transistors.

3. The method of claim 2, wherein said n-type dopant comprises arsenic.

4. The method of claim 2, wherein said n-type dopant comprises both arsenic and phosphorous.

5. The method of claim 2, further comprising the steps of:

a. implanting lightly doped drains on opposite sides of each of said PMOS and NMOS gates after said step of etching said conductive layer; and b. forming sidewall oxides adjacent each of said PMOS and NMOS gates, said resistor and said emitter electrode.

6. The method of claim 2, further comprising the step of siliciding said emitter electrode, said NMOS and PMOS gates, and said NMOS and PMOS source/drain regions.

7. The method of claim 1, wherein said step of forming said PMOS source/drain regions comprises the steps of:

a. implanting said PMOS source/drain regions and said PMOS gate with said p-type dopant; and b. annealing said PMOS source/drain regions.

8. The method of claim 1, wherein said p-type dopant comprises boron.

9. A method for forming a BiCMOS device comprising the steps of:

a. forming a first insulator layer over a surface of a semiconductor body having a first well region;

b. implanting a base region in said first well region;

c. removing said first insulator layer;

d. forming a second insulator layer over said surface of said semiconductor body;

e. etching said second insulator layer to expose a portion of said base region;

f. forming a polysilicon layer over the surface of said semiconductor body;

g. simultaneously implanting a resistor area and a PMOS area of the polysilicon layer with a p-type dopant, said PMOS area corresponding to where a plurality of PMOS transistors are to be formed;

h. implanting a second area of the polysilicon layer corresponding to where a bipolar transistor and a plurality of NMOS transistors are to be formed with a n-type dopant;

i. etching said polysilicon layer to form an emitter electrode, a PMOS gate, a NMOS gate and said resistor;

j. implanting said p-type dopant into said semiconductor body adjacent said PMOS gates to form a pair of PMOS source/drain regions for each of said plurality of PMOS transistors, wherein said p-type dopant is also simultaneously implanted into said PMOS gates;

k. implanting said n-type dopant into said semiconductor body adjacent said NMOS gates to form a pair of NMOS source/drain regions for each of said plurality of NMOS transistors, wherein said n-type dopant is also simultaneously implanted into said NMOS gates; and l. annealing said BiCMOS device.

10. The method of claim 9, wherein said n-type dopant comprises arsenic.

11. The method of claim 9, wherein said n-type dopant comprises both arsenic and phosphorous.

12. The method of claim 9, wherein said p-type dopant comprises boron.

* * * * *